Figure 1:
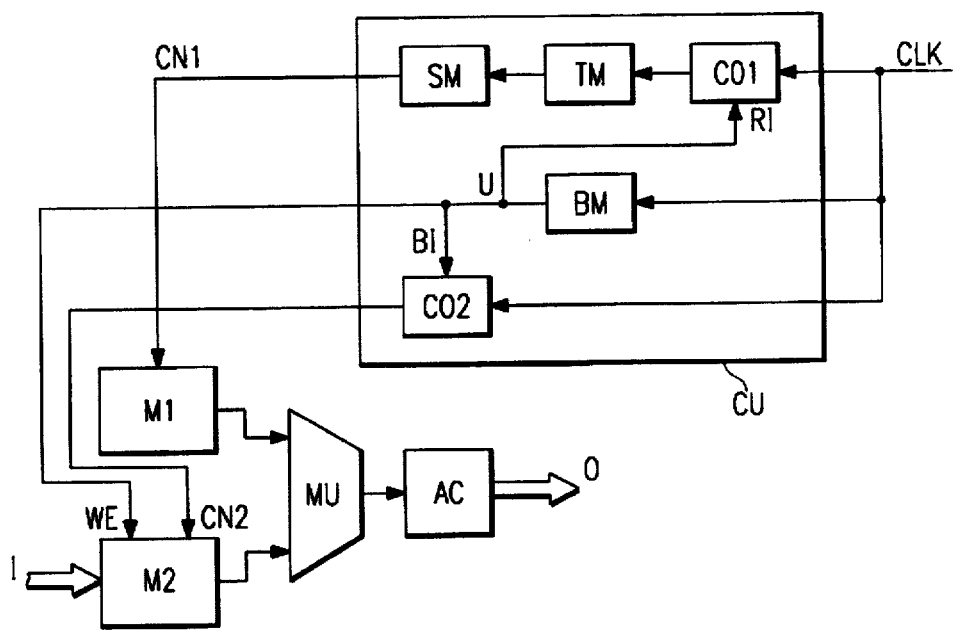

United States Patent [19]

Feste et al.

[11] Patent Number: 5,710,729
[45] Date of Patent: Jan. 20, 1998

[54] FILTERING METHOD AND DIGITAL OVER SAMPLER FILTER WITH A FINITE IMPULSE RESPONSE HAVING A SIMPLIFIED CONTROL UNIT

[75] Inventors: Sandro Delle Feste, Novara; Marco Bianchesi, Sergnano; Alessandro Cremonesi, S. Angelo Lodigiano, all of Italy

[73] Assignee: SGS-Thomson Microelectronics, S.r.l., Agrate Brianza, Italy

[21] Appl. No.: 451,029

[22] Filed: May 31, 1995

[30] Foreign Application Priority Data

Jun. 30, 1994 [EP] European Pat. Off. ............ 94830322.7

[51] Int. Cl.$^6$ ............................ G06F 17/10; G06F 17/17
[52] U.S. Cl. ............................. 364/724.01; 364/724.1
[58] Field of Search ........................ 364/723, 724.1, 364/724.01, 724.13, 725.01

[56] References Cited

U.S. PATENT DOCUMENTS

| | | | |
|---|---|---|---|
| 3,997,772 | 12/1976 | Crochiere et al. | 364/724.1 |
| 4,020,332 | 4/1977 | Crochiere et al. | 364/723 |
| 5,432,511 | 7/1995 | Sadjadian et al. | 341/61 |
| 5,471,411 | 11/1995 | Adams et al. | 364/724.01 |

OTHER PUBLICATIONS

M. Narasimha, "Implementation of Fir Filters with Random Access Memories," Electro Conf. Record, vol. 4 p. 8/2 (1979), Apr.

"Finer Audio from CD'," Machine Design, vol. 61, No. 17, p. 64 (1989), Aug.

*Primary Examiner*—Chuong D. Ngo
*Attorney, Agent, or Firm*—Robert Groover; Betty Formby; Matthew Anderson

[57] ABSTRACT

An oversampling digital filter with Finite Impulse Response is implemented using a serial structure having a memory for the coefficients, a memory for the signal samples to be filter, a multiplier connected to the output of the memories, an accumulator connected to the output of the multiplier, and a simple control unit which controls these elements according to an input clock signal.

11 Claims, 2 Drawing Sheets

FILTERING METHOD AND DIGITAL OVER SAMPLER FILTER WITH A FINITE IMPULSE RESPONSE HAVING A SIMPLIFIED CONTROL UNIT

The present invention relates to a filtering method and an oversampling digital filter with Finite Impulse Response having simple control units.

In the numerical processing of signals, an analog signal is sampled with a frequency which must be at least double the maximum frequency present with a not negligible amplitude in the analog signal spectrum.

In particular, in the field of high-quality audio signals it is useful, starting from the sample flow thus obtained, to generate another flow corresponding to the same analog signal but having a sampling frequency multiple that of an 'oversampling factor' of the original. Said flow is called hereinafter 'oversampling flow' to distinguish it from the 'original flow'.

A class of known methods consists of inserting between two consecutive samples of the original flow a predetermined number of samples having amplitudes which depend on the samples which precede them and follow them in the original flow: constant interpolation, linear interpolation, spline interpolation, etc.

A particular method consists of inserting only null samples. This implies a subsequent filtering to eliminate the spurious spectrum thus generated.

This method gives excellent results because it does not cause any signal band attenuation but involves a very thorough filtering outside the band.

In high-quality audio applications the oversampling flow can reach 200 kHz, every sample can necessitate up to 20 bits for its representation, there can be required attenuation variations of 100 dB in a few kHz, and there can be required a response flatness on the order of 0.001 dB.

By using for filtering a filter with a Finite Impulse Response (FIR) for its qualities of stability and phase control, there may be necessary, in the stringent conditions described above, structures made up of 200 and more coefficients.

Figure 6:
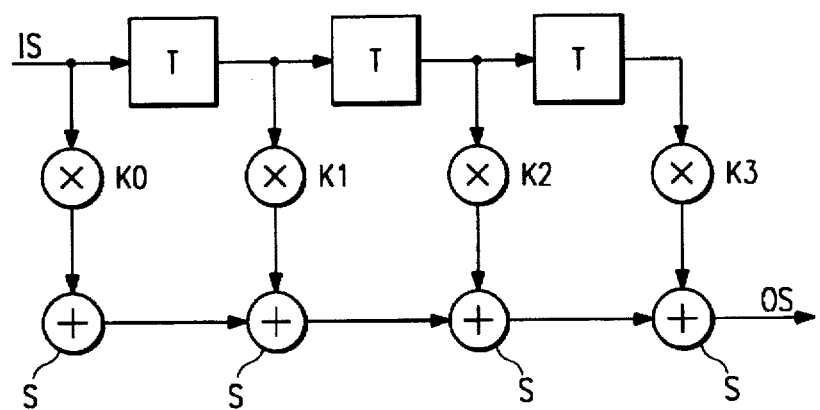

FIG. 6 shows the block diagram of a filter FIR with four coefficients with parallel architecture having input IS and output OS made up of four identical blocks connected in cascade and each one comprising a delay element T, an adder S, and a multiplier K. Each multiplier K multiplies the value at the input for a different fixed coefficient, respectively K0, K1, K2, K3.

The filter of FIG. 6 generates a flow signal of output signals given by the formula:

$$os(n)=is(n)*K0+is(n-1)*K1+is(n-2)*K2+is(n-3)*K3.$$

With 200 coefficients, implementation of the filter by means of a serial architecture is rather advantageous in terms of simplicity of the circuit but of course imposes time requisites on the components of the filter still more stringent than those already imposed by the high-quality audio signal.

The purpose of the present invention is to supply a filtering method which would permit satisfaction of requisites of said amount by means of a filter having a serial architecture with finite impulse response having a simple control unit, and a corresponding filter.

Said purpose is achieved by means of the method having the functionalities set forth in claim 1 and by means of the filter having the characteristics set forth in claim 3.

Further advantageous aspects of the present invention are set forth in the dependent claims.

The idea underlying the present invention is to use a number of coefficients corresponding to a power of 2, an oversampling factor corresponding to a power of 2, and to not perform products with null samples.

In an advantageous embodiment the coefficients of the filter are symmetrical and hence their memorization requires only half the memory cells as the general case but the architecture of the control unit is not deeply penalized thanks to the use of simple address symmetrization means.

Figure 2:
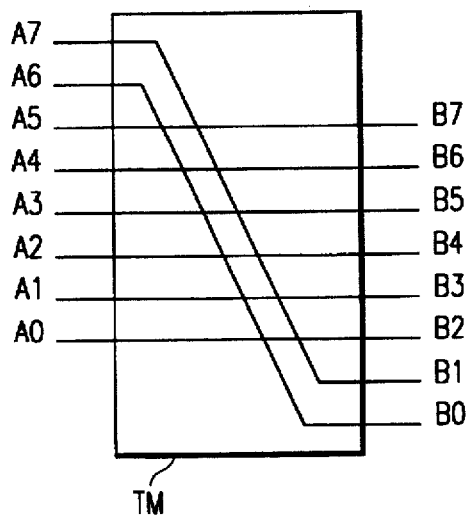
Figure 3:
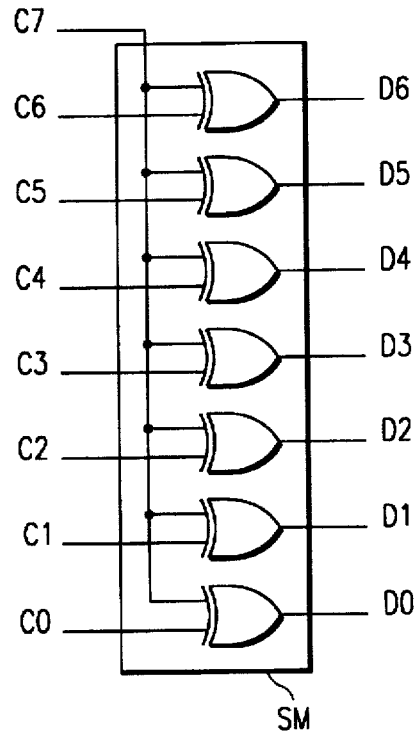
Figure 4:
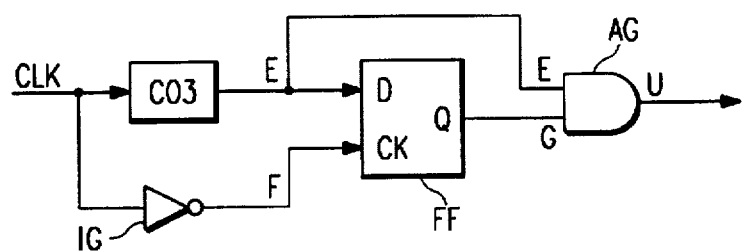
Figure 5:
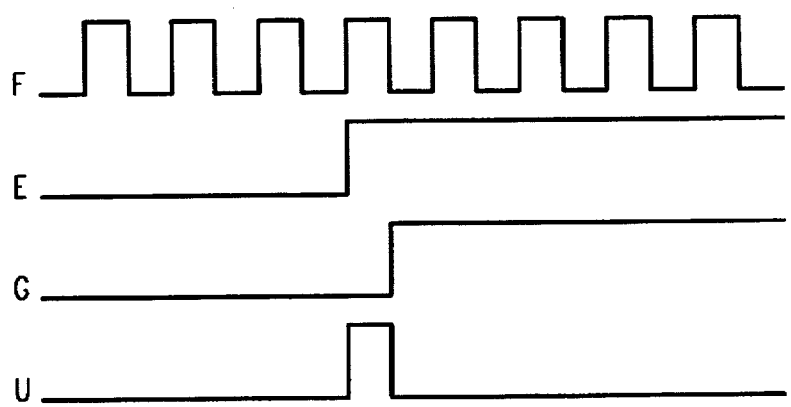

The invention is clarified by the description given below of an embodiment considered together with the annexed drawings wherein:

FIG. 1 shows a block diagram of a possible embodiment of the filter in accordance with the present invention, FIG. 2 shows the electrical diagram of the translation means included in the filter of FIG. 1, FIG. 3 shows the electrical diagram of the symmetrization means included in the filter of FIG. 1, FIG. 4 shows the electrical diagram of the block means included in the filter of FIG. 1, FIG. 5 shows a temporal diagram of the signals present in the circuit of FIG. 4 during a particular step of operation, and FIG. 6 shows a block diagram of an F.I.R. filter with parallel architecture in accordance with the known art.

A generic F.I.R. filter with L coefficients implements the known formula:

$$y(n)=Sum[j=1..L]k(j)\times(n-j)$$

where k(j) indicates the generic coefficient of the filter with x() an input sample, with y() an output sample, and with Sum[..] is indicated the summation of the product following on variation of the index "j" in the interval 1 .. L.

A serial embodiment implies that for every output sample it is necessary to perform in sequence L products and L sums. This operation can also be described as the product of a vector, e.g. a row, consisting of the L coefficients of the filter and a vector, e.g. a column, consisting of L consecutive input samples. It is then necessary to arrange a clock signal having a period at least L times as small as that of sampling.

In general both the coefficients and the input samples are memorized in memories, then for each output sample L additional addressings and L additional readings in memory are necessary.

It is advantageous to choose L equal to a power of 2, i.e. $L=2^N$. In this case the generation of the addresses can be done simply and efficiently by supplying the clock signal at the input of a modulus counter $2^N$.

If it is chosen to oversample by inserting null samples it is advantageous to memorize only the not null samples, which are the minority.

As clarified below, it is advantageous to choose the oversampling factor equal to a submultiple of the length L of the filter, i.e. equal to a power of 2. Then of $2^N$ samples only $2^M$ are other than zero and the oversampling factor is equal to $2^{(N-M)}$. In this case the number of products and sums to be performed is only $2^M$.

Assuming, e.g., N=8 and M=6, at a certain instant t0 the vector of the samples to be used will be:

x(0), x(1), x(2), . . . x(61), x(62), x(63);

and the vector of the coefficients to use will be:

k(0), k(4), k(8), . . . k(244), k(248), k(252);

at the next instant t1, the vector of the samples to use will be:

x(0), x(1), x(2), . . . x(61), x(62), x(63);

and the vector of the coefficients to use will be:

k(1), k(5), k(9), . . . k(245), k(249), k(253);

at the next instant t2, the vector of the samples to use will be:

x(0), x(1), x(2), ... x(61), x(62), x(63);

and the vector of the coefficients to use will be:

k(2), k(6), k(10), ... k(246), k(250), k(254);

at the next instant t4, the vector of the samples to use will be:

x(0), x(1), x(2), ... x(61), x(62), x(63);

and the vector of the coefficients to use will be:

k(3), k(7), k(11), ... k(247), k(251), k(255);

at the next instant t5, there will be repeated the situation of the instant t1 with the difference that the samples will be translated in time by one period, i.e. by one position in the vector, and that the sample x(0) will be the new sample just supplied at the filter input.

To make address generation for the coefficients simple and efficient, there are two possibilities, practicable only if the power oversampling factor is 2. These possibilities are conceptually equivalent.

The first possibility consists of memorizing the coefficients of the filter in an appropriate order and addressing them by strictly sequential addresses. With reference to the above example, said order would be:

k(0), k(4), ... k(252), k(1), k(5), ... k(253), ... k(255).

The second consists of memorizing the coefficients of the filter in strictly sequential order and addressing them appropriately. With reference to the above example and FIG. 2, the 8 address bits, indicated by B0..B7, can be generated in a very simple manner starting from the 8 output bits, indicated by A0..A7, of a modulus counter 256 connecting the two most significant bits A6 and A7 to the two least significant bits B0 and B1 and the six least significant bits A0..A5 to the six most significant bits B2..B7.

Generation of the addresses for the samples presents no problem and can be done by means of a modulus counter 64.

In many applications, including audio, it is useful that the filter transfer function have a linear phase. To secure this, the filter coefficients must be symmetrical, i.e., in the case where N=8:

$$k(0)=k(255)\ k(1)=k(254)\ \ldots\ k(127)=k(128).$$

To take full advantage of this property it is advantageous to memorize only the first 128 coefficients and automatically address by means of an address reduced to 7 bits again the appropriate coefficient having a position lower than 128.

To make address generation for the coefficients still simple and efficient, there was found a simple solution possible only if the filter length is a multiple of 2.

Indeed, if N=8 and with reference to FIG. 3, the 7 address bits, indicated by D0..D6, can be generated very simply starting from 8 input bits, indicated by C0..C7, by means of respective XOR operations between the most significant bit C7 and the remaining bits C0..C6.

Naturally if the null sample and linear phase situations appear together, as occurs rather often, the above described possibilities can be combined advantageously. For example, in the case of N=8 and M=6 the memorization order would be:

k(0), k(4), ... k(124), k(127), k(123), k(119), ... k(7), k(3), k(1), k(5), ... k(121), k(125), k(126), k(122), ... k(6), k(2).

With reference to FIG. 1 there is now discussed an embodiment of the filter in accordance with the present invention.

Said filter exhibits an input I and an output O and a first memory M1 for memorization of the coefficients. The input I is connected to the data input of a second memory M2. The data outputs of the two memories M1 and M2 are connected to a multiplier MU. The output of the multiplier MU is connected to an accumulator AC by means of its data input.

Said accumulator AC is designed to add the content of itself with the value present at the data input and present it at the data output, which is connected to the output O of the filter.

The memory M1 can be equipped with a data input (not shown in the figures) if in a particular application it is necessary to change the coefficients of the filter during its operation.

The filter also comprises a control unit CU to control and co-ordinate the operations of the various blocks making up the filter.

Said control unit CU receives at input a clock signal CLK having a frequency which is a multiple of that of sampling of the signal supplied at the input of the filter, as explained above.

There are various signals which the control unit CU must send to the various blocks as will be clear to those skilled in the art, but only those useful for understanding the present invention are discussed below. It generates a control signal which is sent to a first control input CN1 of the memory M1 and a control signal which is sent to a second control input CN2 of the memory M2. In addition, it sends a block signal U to a write enable input WE of the memory M2 of the samples to permit memorization of the new samples which progressively reach the filter.

The two control inputs CN1 and CN2 correspond basically to the address input and the read enable input of the memories.

The control unit CU comprises among other things addressing means having a structure such as to implement the method in accordance with the present invention.

Said means can comprise for generation of the address to be sent to the first control input CN1: a first counter CO1 receiving at input the clock signal CLK, translation means TM connected to the output of the counter CO1, and symmetrization means SM connected to the output of the translation means TM. For generation of the address to be sent to the second control input CN2 they can include simply a second counter CO2 receiving at input the clock signal CLK. For generation of the block signal U they can include block means BM receiving at input the clock signal CLK. It should be noted that the block signal U is sent also to the reset input RI of the counter CO1 and to the block input BI of the second counter CO2.

If N=8 and M=6, the counter CO1 is a modulus counter 256, the second counter CO2 is a modulus counter 64, the circuit of the translation means TM is shown in FIG. 2 and was already discussed above, the same applies to the circuit of the symmetrization means SM with reference to FIG. 3.

Special concern is due to the block means BM and its circuit shown in FIG. 4.

This circuit must permit loading a new sample in memory M2 during a period of the clock signal CLK and at the same time the blocking of the second counter CO2 generating the addresses of the memory M2 of the samples and resetting the counter CO1 generating the addresses of the memory M1 of the coefficients so as to phase shift the two counters by one clock stroke. In this manner, insertion of a new sample is done simply and without losing any clock strokes and is thus transparent to the flow of output samples at the filter.

The simple and efficient embodiment of FIG. 4 comprises a third counter CO3 which acts as a divider, receives at input the clock signal CLK and generates the divided signal E, a logic port IG of NOT type which receives at input the clock signal CLK and generates a negated signal F, a type D flip-flop FF which receives at the input D the divided signal E and at the clock input the negated signal F and generates a status signal G at its output Q and an AND type logic gate AG which receives at its inputs the divided signal E and the status signal G and generates the block signal U. If N=8 and M=6, the third counter CO3 is a modulus counter 256 and hence acts as a divider for 256.

The behavior of the signals E,F,G,U is shown in FIG. 5 around the instant in which an impulse of the block signal U is generated.

Finally, on condition that the accumulator AC is capable of supplying at output the result of the accumulation and simultaneously, in the same clock cycle, resetting itself to initiate a new accumulation cycle, the filter completes its filtering operation in a number of clock cycles exactly equal to the number of multiplications necessary (in the example 64) and does not need clock cycles for the housekeeping operations.

What is claimed is:

1. A digital filter designed to receive at an input a flow of input samples and generate at an output a flow of oversampled output samples, said digital filter comprising:
   a) first memory means designed to memorize a sequence of $2^N$ filtering coefficients having a data output and a first control input,
   b) second memory means designed to memorize at least $2^M$ consecutive samples of said input flow, M being less than N, having a data input connected to said input of said filter and having a data output and a second control input,
   c) a multiplier having data inputs connected to the data outputs of said memory means and having a data output,
   d) an accumulator having a data input connected to the data output, of said multiplier and a data output connected to said output of said filter and designed to add the content of itself with the value present at the data input and present at the data output the result of said sum, and
   e) a control unit comprising addressing means connected to said control inputs;
   wherein said addressing means comprise a first counter modulus $2^N$ receiving at input a clock signal generating at output a first word made up of N bits and wherein said filtering coefficients are memorized in said first memory means;
   wherein said addressing means comprise additional translation means designed to read said first word and generate a third word made up of N bits of which the N–M least significant bits correspond to the N–M most significant bits of said first word and the M most significant bits correspond to the M least significant bits of said first word and are designed to supply to said first control input said third word.

2. The filter of claim 1 wherein said first memory means are designed to memorize only the first $2^{(N-1)}$ filtering coefficients.

3. The filter of claim 1 in which said addressing means comprises additional symmetrization means designed to read said third word and generate a fourth word made up of N-1 bits found by means of respective XOR operations between the most significant bit and the other bits of said third word and are designed to supply to said first control input instead of said third word said fourth word.

4. The filter of claim 1, in which said addressing means comprises additionally a second counter modulus 2M receiving at input said clock signal generating at output a fifth word made up of M bits and are designed to supply said fifth word to said second control input and in which said control unit comprises also block means designed to generate a block signal active for the duration of a semi-period every 2N periods of said clock signal and supply it to a write enable input of said second memory means at a reset input of said first counter and a block input of said second counter.

5. A digital filter designed to receive at an input a flow of input samples and generate at an output a flow of oversampled output samples, said digital filter comprising:
   a) first memory means designed to memorize a sequence of $2^N$ filtering coefficients having a data output and a first control input,
   b) second memory means designed to memorize at least $2^M$ consecutive samples of said input flow, M being less than N, having a data input connected to said input of said filter and having a data output and a second control input,
   c) a multiplier having data inputs connected to the data outputs of said memory means and having a data output,
   d) an accumulator having a data input connected to the data output or said multiplier and a data output connected to said output of said filter and designed to add the content of itself with the value present at the data input and present at the data output the result of said sum, and
   e) a control unit comprising addressing means connected to said control inputs;
   wherein said addressing means comprise a first counter modulus $2^N$ receiving at input a clock signal generating at output a first word made up of N bits and are designed to supply said first word to said first control input and wherein said filtering coefficients are memorized in said first memory means;
   wherein said addressing means comprise additionally a second counter modulus $2^M$ receiving at input said clock signal generating at output a fifth word made up of M bits and are designed to supply said fifth word to said second control input and in which said control unit comprises also block means designed to generate a block signal, which is active for the duration of a semi-period of said clock signal, every $2^N$ periods of said clock signal and supply it to a write enablement input of said second memory means at a reset input of said first counter and a block input of said second counter.

6. A filtering circuit, comprising:
   a first counter which is modulo 2N and which is operatively connected to be clocked by a clock signal and operatively connected to provide addresses to a coefficient memory;
   a second counter which is modulo 2M, where M is less than N, and which is operatively connected to be clocked by said clock signal and operatively connected to control the output of a data memory which is connected to receive an incoming sequence of data;
   a third counter which is interconnected with additional logic to generate an output pulse once in 2N cycles of said clock signal, said output pulse being connected to reset said first counter and to activate said second counter; and multiply and accumulate logic connected to multiply data from said data memory with coefficients from said coefficient memory and provide a filtered output from summed partial products thereof wherein said first counter is connected through a translation circuit which interchanges M–N more significant bits with N less significant bits to provide retrieval of coefficients in a predetermined sequence.

7. The circuit of claim 6, wherein said output pulse is also connected to enable writing of successive elements of said sequence of data into said data memory.

8. The circuit of claim 6, wherein said first counter is connected through a symmetrization circuit to provide retrieval of coefficients in a symmetric pattern for linear phase filtering.

9. A filtering method, comprising the non-sequential steps of:

clocking a first counter which is modulo 2N with a clock signal; clocking a second counter which is modulo 2M, where M is less than N, with said clock signal;

clocking a third counter to generate an output pulse therefrom once in 2N cycles of said clock signal;

applying said output pulse to reset said first counter and to activate said second counter;

providing addresses to a coefficient memory in dependence on outputs of said first counter;

applying an output of said third counter as a control signal to control the output of a data memory which is connected to receive an incoming sequence of data; and multiplying data from said data memory with coefficients from said coefficient memory, and accumulating products therefrom, to provide a filtered output signal;

wherein said first counter is connected through a translation circuit which interchanges M–N more significant bits with N less significant bits to provide retrieval of coefficients in a predetermined sequence.

10. The method of claim 9, wherein said output pulse is also connected to enable writing of successive elements of said sequence of data into said data memory.

11. The method of claim 9, wherein said first counter is connected through a symmetrization circuit to provide retrieval of coefficients in a symmetric pattern for linear phase filtering.

* * * * *